United States Patent [19]

Boultinghouse et al.

[11] Patent Number: 4,532,015

[45] Date of Patent: Jul. 30, 1985

[54] POLY(ARYLENE SULFIDE) PRINTED CIRCUIT BOARDS

[75] Inventors: Harold D. Boultinghouse; Paul J. Boeke; Robert E. Benefield, Jr.; John Leland, all of Bartlesville, Okla.

[73] Assignee: Phillips Petroleum Company, Bartlesville, Okla.

[21] Appl. No.: 409,792

[22] Filed: Aug. 20, 1982

[51] Int. Cl.³ .............................................. C23C 3/02
[52] U.S. Cl. .................. 204/38.4; 204/35.1; 204/37.1; 427/57; 427/98; 427/290; 427/306; 427/307; 427/331
[58] Field of Search ............... 427/331, 98, 306, 307, 427/57, 290; 204/38 B, 35.1, 37.1

[56] References Cited

U.S. PATENT DOCUMENTS

| | | | |
|---|---|---|---|
| 3,567,594 | 3/1971 | Wells | 204/20 |
| 3,770,571 | 11/1973 | Alsberg | 427/98 |
| 3,983,267 | 9/1976 | Norris | 427/307 |
| 4,274,993 | 6/1981 | Narisawa | 264/331 |
| 4,303,781 | 12/1981 | Idel | 528/388 |
| 4,447,471 | 5/1984 | Putt | 427/98 |

FOREIGN PATENT DOCUMENTS 2424702 12/1975 Fed. Rep. of Germany.

OTHER PUBLICATIONS

Angelo, "Improved Adhesion for Additive Circuitry Fabrication" IBM TDB vol. 14, No. 9, p. 2693, Feb. 1972.

*Primary Examiner*—John D. Smith
*Attorney, Agent, or Firm*—S. E. Reiter

[57] ABSTRACT

A printed circuit board is made of poly(arylene sulfide) board and a conductive metal deposited on the board by electroless plating. Adhesion between the poly(arylene sulfide) and the conductive metal is improved by allowing the plated poly(arylene sulfide) to age.

34 Claims, No Drawings

POLY(ARYLENE SULFIDE) PRINTED CIRCUIT BOARDS

This invention relates to printed circuit boards. In another aspect this invention relates to the plating of poly(arylene sulfide) boards with a conductive metal to produce printed circuit boards. In yet another aspect this invention relates to the adhesion between a poly(arylene sulfide) substrate and a conductive metal plated thereon.

BACKGROUND

Printed circuit boards represent today a very substantial and rapidly growing market. They can be used, for example, in communications, instruments, controls, military, aerospace and business applications. Printed circuit boards other than copper clad laminates are typically manufactured by plating an epoxy or phenolic compound or some other heatstable dielectric resin with a conductive metal such as, for example, copper. It is also known to plate flexible films of polyester and polyimide for this purpose. The successful production of printed circuit boards is a complex and sophisticated art that, though rapidly advancing, has yet to pass beyond the adolescence of its evolution.

Processing techniques known in the art include methods commonly identified as the subtractive method, the semiadditive method, the additive method and modifications and variations of the above. Electroless plating of the board (i.e. epoxy resin, phenolic resin, etc.) with a conductive metal is a crucial part of the overall process. After electroless deposition of a layer of the conductive metal onto the board the board is typically further plated with more of the conductive metal in accordance with conventional electroplating techniques to increase the thickness of the layer.

Absolutely essential to the success of the finished product is good adhesion of the conductive metal (which after processing represents the circuitry) to the board (i.e. epoxy resin, phenolic resin, etc.). In the absence of satisfactory adhesion the circuitry loses its structural integrity and the printed circuit board fails to perform its intended function. Those of skill in the art seek to discover new materials which can be used in the manufacture of printed circuit boards. The challenge is to find materials which will give good adhesion and yet possess other attributes (such as, for example, high temperature resistance) that are needed in printed circuit boards.

Poly(phenylene sulfide) is a material which possesses many of these desired attributes (such as, for example, high temperature resistance) but to the limited extent it has been considered at all it has been rejected by those of skill in the art as a material suitable for printed circuit board application, the belief being that satisfactory adhesion of the conductive metal to the poly(phenylene sulfide) cannot be obtained.

SUMMARY OF THE INVENTION

In accordance with this invention a printed circuit board is produced by electroless plating of a conductive metal onto a poly(arylene sulfide) board. The electroless plating step can be followed with an electroplating operation to deposit most conductive metal onto the board. By allowing the plated board to age, improved adhesion can be obtained.

In the preferred embodiment of this invention the poly(arylene sulfide) board is made of poly(phenylene sulfide) and the conductive metal is copper.

DETAILED DESCRIPTION

In accordance with this invention a printed circuit board is produced by electroless plating of a conductive metal such as, for example, copper onto a poly(arylene sulfide) board. The electroless plating step can be followed by an electroplating step to deposit more conductive metal onto the board.

Various techniques can be used to create the circuitry on the board. Substractive methods can be used to remove undesired conductive metal from the plated board thus leaving the remaining conductive metal in the form and shape needed to define the desired circuitry. Additive methods can be used such that the conductive metal is plated only onto preselected portions of the board thus creating the desired circuitry upon deposition. These circuitry-creating techniques and modifications and variations thereof are known in the art and can be readily adapted to produce the printed circuit boards of this invention. This invention can also be practiced in combination with other circuitry-creating techniques yet to be developed or commonly practiced.

The key to this invention resides not in any particular circuitry-creating technique but rather more fundamentally in the recognition that poly(arylene sulfide) such as, for example, poly(phenylene sulfide), can be successfully used in the manufacture of printed circuit boards with satisfactory adhesion. One of the purposes of this disclosure is to teach how to obtain and recognize this success.

Electroless plating, also known as autocatalytic plating, is commonly defined as the deposition of a metallic coating or film onto a substrate by the interaction in solution of a metal salt and a chemical reducing agent, whereby this chemical reduction is catalyzed by the metal or alloy being deposited. In the practice of this invention the electroless metal can be any conductive metal capable of being used in an electroless plating operation. Copper and nickel are two such metals, each being especially well suited for this purpose. The term conductive metal is intended to include conductive alloys.

The substrate, for the purposes of this invention, is a poly(arylene sulfide) board. Poly(arylene sulfide) is used here to designate arylene sulfide polymers.

Without being limited thereto, uncured or partially cured poly(arylene sulfide) whether homopolymer, copolymer, terpolymer, and the like, or a blend of such polymers, can be used in the practice of my invention. The uncured or partially cured polymer is a polymer the molecular weight of which can be increased by either lengthening of a molecular chain or by crosslinking or by combination of both by supplying thereto sufficient energy, such as heat. Suitable poly(arylene sulfide) polymers include, but are not limited to, those described in U.S. Pat. No. 3,354,129, incorporated by reference herein. Examples of poly(arylene sulfide) polymers suitable for purposes of my invention include poly(2,4-tolylene sulfide), poly(4,4'-biphenylene sulfide) and poly(phenylene sulfide). Because of its availability and desirable properties (such as high chemical resistance, nonflammability, and high strength and hardness) poly(phenylene sulfide) is the presently preferred poly(arylene sulfide).

For the purpose of understanding this disclosure and of interpreting the appended claims, it should be noted that the poly(arylene sulfide) board is comprised of poly(arylene sulfide) and can include, as desired, other materials such as, for example, fillers and processing aids. The presence of glass fibers is preferred because of their reinforcement utility. Calcium carbonate and calcium sulfate can also be present.

The board is a substrate which supports a conductive metal circuitry deposited thereon. Preferably the board is an injection molded board having molded-in holes.

Good adhesion requires careful preparation of the poly(arylene sulfide) board prior to the electroless plating operation. This preparation entails treating the normally smooth poly(arylene sulfide) board surface to create a coarser, rougher, more uneven or more irregular surface. This can be accomplished by chemically and/or physically altering the surface. Chemical etchants, grit blasting or mechanical abrading can be used for this purpose.

Poly(arylene sulfide) polymers such as poly(phenylene sulfide) polymers are well known for their strong chemical resistance. This strong chemical resistance makes selection of an effective chemical etchant very important. A strong oxidizing agent such as nitric acid alone or, even more advantageously, in combination with hydrofluoric acid can be used as the chemical etchant. The nitric acid not only causes chemical degradation of the polymer but also dissolves calcium carbonate, calcium sulfate and certain other fillers which can be found in the polymer. The hydrofluoric acid contributes by partially dissolving glass fillers in the polymer.

It is believed that chemical etchants improve adhesion in two ways. First, by altering the physical structure of the polymer surface (i.e. by making it coarser, rougher, etc.) a better mechanical "lock" of metal to the polymer surface is effected. Secondly, by chemically modifying the polymer surface to give a more hydrophilic surface, stronger chemical bonding of the metal to the polymer results.

Grit blasting can be used to physically remove a polymer-rich surface and thereby expose a more filled surface area to the chemical etchant. Grit blasting can be followed by ultrasonic cleaning to remove particles from the surface.

A catalyst is usually needed to initiate the electroless deposition process. The poly(arylene sulfide) board can be treated with the catalyst, for example a palladium-tin catalyst, prior to the electroless plating operation. Note that the need for the catalyst is short-lived since once initiated the electroless process is autocatalytic, i.e. catalyzed by the conductive metal (e.g. copper, nickel, etc.) deposited on the polymer surface.

The electroless plating operation itself can be conducted in a bath-containing tank. Preferably the tank is made of plastic or lined with plastic or made of passivated stainless steel to prevent plating of the tank itself. The electroless plating bath contains (typically in solution) the conductive metal (e.g. copper, nickel, etc.) to be deposited on the poly(arylene sulfide) board. The electroless plating operation can be carried out in accordance with conventional electroless plating methods and techniques.

Persons of skill in the relevant art possess sufficient knowledge of electroless plating that, when coupled with this disclosure, will enable them to practice this invention. More detailed and complete information concerning electroless plating is readily available to those who seek it. One such source of information, incorporated by reference herein, is the Kirk-Othmer Encyclopedia of Chemical Technology, Third Edition, Volume 8, pages 738 to 750 and 859–860.

Electroless plating is a relatively slow process in that it requires a relatively long time to build up a sufficiently thick deposit of conductive metal on the poly(arylene sulfide) board. For this reason it is preferred to terminate the electroless plating operation after the deposited conductive metal has obtained a thickness of at least about 20 microns and to use electroplating to supply the desired additional conductive metal. The thin deposit of conductive metal deposited during the electroless plating operation is referred to as an electroless film. The electroless film serves two purposes. First, it provides the poly(arylene sulfide) board with an electrically conductive surface needed to allow further deposition of conductive metal by electroplating. Secondly, the electroless film creates a bond between the poly(arylene sulfide) board and the electroplated conductive metal.

Electroplating is essentially the electrodeposition of an adherent metallic coating onto an electrode. This invention can be successfully practiced by employing conventional electroplating methods and apparatus. Typically, the poly(arylene sulfide) board having the electroless film can be positioned in a tank containing a plating solution (usually aqueous). The plating solution provides ions of the conductive metal to be deposited.

The conductive metal can be any conductive metal capable of being electroplated onto the electroless film coated poly(arylene sulfide) board. Examples of such metals include, but are not limited to, copper and nickel. The term conductive metal is intended to include conductive alloys. The conductive metal need not be the same metal of which the electroless film is comprised.

Persons of skill in the relevant art possess sufficient knowledge of electroplating such that this knowledge coupled with this disclosure will enable them to practice this invention. More detailed and complete information concerning electroplating is readily available to those who seek it. One such source of information, incorporated by reference herein, is the Kirk-Othmer Encyclopedia of Chemical Technology, Third Edition, Vol. 8, pages 826 to 869.

The electroplating operation continues until the desired amount of conductive metal has been deposited. The thickness of the total amount of conductive metal deposited (by both the electroless plating and electroplating operations) onto the poly(arylene sulfide) board will depend upon the intended application of the product (i.e. the printed circuit board). Typically, this thickness will be within the range of about 1 mil to about 4 mils.

The strength of the adhesion between the conductive metal and the poly(arylene sulfide) board is of crucial importance to the successful manufacture of the printed circuit board. If the adhesion strength is too low the detailed circuitry (which is comprised of the conductive metal) cannot maintain its structural integrity and the printed circuit board is useless for practical application. For this reason it is absolutely essential that the adhesion between the conductive metal and the poly(arylene sulfide) board be sufficiently strong to withstand the rigors to which printed circuit boards are typically subjected. This adhesion strength is commonly referred to, and measured in terms of, peel strength. To be useful at all for practical applications the printed circuit board must have sufficient metal to board adhesion strength such that the peel strength is at least about 4 pounds per inch. A good product, however, will be characterized by a peel strength of at least about 5 pounds per inch and preferably at least about 6 pounds per inch. In some instances, experiments conducted in accordance with this invention have yielded plated poly(arylene sulfide) boards having outstanding peel strengths of above 7 and even above 8 pounds per inch. The above peel strengths reflect values as measured in accordance with ASTM Test Method Part 9 B533-79 Procedure A which is the ASTM test for peel strength of metal-electroplated plastics. For the purposes of this disclosure and the appended claims this ASTM test method is modified to the extent that the test procedure is carried out irrespective of the thickness of the metallic coating.

It has been discovered that the adhesion between the conductive metal and the poly(arylene sulfide) board improves significantly with aging. Immediately after the electroplating operation (or electroless plating operation if electroplating is not employed) adhesion strength is at a minimum. If allowed to age the adhesion strength can reach a maximum level within a matter of a few days. After about 5 days a peel strength test will indicate this maximum level. Thus, properly plated poly(arylene sulfide) boards when initially tested for peel strength can give peel strength results far below the minimum acceptable level. But rather than discarding the boards and giving up, success can still be achieved by patiently allowing the boards to age until they exhibit peel strengths of at least about 4 pounds per inch or, for good results, of at least about 5 pounds per inch.

The aging period can be accelerated by heating above ambient temperature, curing or drying the poly(arylene sulfide) board.

The following example is given to facilitate a full and complete disclosure of this invention. The example was chosen because of the good results obtained and because those results clearly demonstrate the utility of the above-described post-plating improvement of adhesion.

EXAMPLE

Two poly(phenylene sulfide) boards, designated samples A and B, were used in this example. Each board was about 4"×4" and had a thickness of about 3/16". The compositions corresponding to Samples A and B are set forth below:

|  | A | B |
| --- | --- | --- |
| Poly(phenylene sulfide) | 58.9% | 35.0% |
| Glass fibers (0.125" long × 0.00062" dia.) | 40.0% | 35.0% |
| Calcium carbonate | — | 28.75% |
| Lithium carbonate | 1.0% | 1.0% |
| Polyethylene | — | 0.25% |
| Zinc stearate | 0.1% | — |

The percentages given above are weight percentages and are based upon total weight of the composition. The poly(phenylene sulfide) in Sample A was characterized by a flow rate of 100–140 g/10 min. The poly(phenylene sulfide) in Sample B was characterized by a flow rate of 750–950 g/10 min. The above flow rates correspond to ASTM Test Method D 1238, Procedure B modified to use a temperature of 600° F. and a 5 kg weight.

The glass fibers reinforce the composition and impart strength to it. Calcium carbonate is used primarily to reduce material cost since it is less expensive than poly(phenylene sulfide) or glass fibers. Lithium carbonate is a mold corrosion inhibitor. Polyethylene and zinc stearate are conventional processing aids.

The experiment proceeded as outlined below except as otherwise indicated. To facilitate teaching the best mode of this invention as presently contemplated certain steps not actually performed in this particular experiment are also set forth below. These non-performed steps are designated as such.

Step 1 Grit Blast:
Both boards were lightly grit blasted with 80 mesh aluminum oxide at 90 psi. The grit blasting removes gloss and roughens the board's surface.

Step 2 Ultrasonic Cleaning:
The boards were immersed for 5 minutes in an ultrasonic bath containing a water solution of a non-silicated soap, Microcleaner TM (sold by International Products Corp. of Trenton, N.J.). The solution consisted of 2½ oz. of Microcleaner per gallon of water.

Step 3 Rinse:
The boards were rinsed in tap water for 30 seconds at room temperature.

Step 4 Drying:
The boards were dried overnight in an oven at about 150° F.

Step 5 Acid Etch:
The boards were immersed in a concentrated solution of hydrofluoric acid (reagent grade HF) for 5 minutes at room temperature.

Step 6 Rinse:
The boards were rinsed in de-ionized water for 30 seconds at room temperature.

Step 7 Acid Etch:
The boards were immersed in concentrated nitric acid (reagent grade 67% $HNO_3$) for 15 seconds at 150° C.

Step 8 Rinse:
The boards were rinsed in de-ionized water for 30 seconds at room temperature.

Step 9 Ultrasonic Cleaning
Same as step 2 above.

Step 10 Mechanical Scrub:
The boards were scrubbed with scouring pads to remove powdery poly(phenylene sulfide) from the surface of each board.

Step 11 Rinse:
The boards were rinsed in de-ionized water for 30 seconds at room temperature.

Step 12 Preprep:
Though not actually employed in this experiment it is believed that this step is advisable since it reduces the risk of contamination of the catalyst bath. In accordance with this step the boards would be immersed in an aqueous 3 normal solution of hydrochloric acid.

Step 13 Catalyst and Activation:
The boards were immersed in a solution for 3 minutes at room temperature. This solution consisted of (a) ½ gallon de-ionized water, (b) 170 grams catalyst, and (c) 340 ml of 37% hydrochloric acid. The catalyst was a palladium-tin catalyst marketed by the McGean Chemical Co. under the trademark Besbon Catalyst DC-3.

Step 14 Rinse:

The boards were thoroughly rinsed 3 times in de-ionized water at room temperature. Stannous hydroxide forms during this step.

Step 15 Acceleration:

The boards were immersed at room temperature for 4 minutes in a solution consisting of (a) ¼ gallon de-ionized water, (b) 19 ml of 37% hydrochloric acid, and (c) 113 grams of D-25. D-25 is the trademark for a mild acid salt with fluorides marketed by the McGean Chemical Co. This step removes excess stannous hydroxide and thus exposes palladium nuclei for subsequent electroless deposition.

Step 16 Rinse:

The boards were rinsed in de-ionized water for 30 seconds at room temperature.

Step 17 Preprep:

Though not actually employed in this experiment it is advisable to immerse the boards at room temperature for 1½ minutes in a preprep solution consisting of de-ionized water and 10% by volume FL-1. FL-1 is a proprietary product of the McGean Chemical Co. sold under the trademark Besbon FL-1.

Step 18 Electroless Plating:

The boards were immersed in a solution consisting of (a) de-ionized water, (b) FL-1 (10% by volume), and (c) FL-2 (1.5% by volume). FL-1 and FL-2 are proprietary products sold by the McGean Chemical Co. of Cleveland, Ohio under the trademarks Besbon FL-1 and Besbon FL-2 for 12 minutes to produce a copper plating having a thickness of about 20 microns.

Step 19 Rinse:

The boards were rinsed in de-ionized water for 30 seconds at room temperature.

Step 20 Oven Dry:

The boards were dried in an oven at 150° F. for 12 hours.

Step 21 Pretreatment:

Though not actually employed in this experiment this step is believed advisable. The boards can be given a quick dip into a 5% hydrosulfuric acid in water solution at room temperature.

Step 22 Electroplating:

The boards were immersed in an acid copper solution contained in a conventional electroplating tank having conventional electroplating apparatus. The acid copper solution consisted of (a) water, (b) 12 oz of copper sulfide per gallon of water, (c) 28 oz. of sulfuric acid per gallon of water, (d) 25 ppm reagent grade HCl, and (e) 5 cc of 339 Brightener ™ per liter of water. The 339 Brightener is a proprietary product of the McGean Chemical Company. A cathode clip was connected to the board. The rectifier (part of the conventional electroplating apparatus) was initially set at ½ amp. After 3 minutes of current the rectifier setting was raised to 2 amps and maintained there for about 2 hours to produce a copper plating having a total thickness of about 4 mils.

Step 23 Rinse:

The boards were rinsed in tap water for 30 seconds at room temperature.

Step 24 Oven Cure:

The boards were cured in an oven at 150° F. for 12 hours.

Step 25 Aging:

The boards were stored at room temperature for 20 days.

Each board was tested once for peel strength after step 23. The first board (A) was tested twice for peel strength after step 25. The second board (B) was tested 3 times for peel strength after step 25. The results of these tests are presented below in Table I.

TABLE I

| Board | Initial Peel Strength (after step 23) | Peel Strength After Aging (after step 25) |
|---|---|---|
| First (A) | 2.6 lb/inch | 8.16 lb/inch |
|  |  | 7.06 lb/inch |
| Second (B) | 2.87 lb/inch | 5.07 lb/inch |
|  |  | 5.51 lb/inch |
|  |  | 6.09 lb/inch |

The peel strength tests were made using a Chatillon pull tester Model DPP 5000 made by John Chatillon and Sons, New York, N.Y. For each test, a strip ¼" by 4" was cut on the board. A ¼" long portion of the strip was peeled up from the board. Strapping tape was attached to both sides of the peeled up portion. The pull tester was hooked up to the strapping tape. Using this arrangement the strip was peeled from the board. The pull tester indicated peel strength in terms of pounds per inch. This simple test was used to approximate the test results that would have been obtained with the ASTM test method.

The data in Table I show that for each sample the initial peel strength (and thus the initial adhesion of copper to the poly(phenylene sulfide) board) was unacceptable for printed circuit boards. However, after aging, the peel strength improved significantly to the levels needed to give a high quality printed circuit board.

We claim:

1. A method for obtaining improved adhesion between a conductive metal and a poly(arylene sulfide) substrate comprising (a) depositing said conductive metal onto said poly(arylene sulfide) substrate by electroless plating, and (b) aging the plated substrate produced in (a) for a time sufficient for the adhesion between said conductive metal and said poly(arylene sulfide) substrate as tested by peel strength immediately after the electroless plating to improve significantly.

2. A method in accordance with claim 1 wherein said poly(arylene sulfide) is poly(phenylene sulfide).

3. A method in accordance with claim 1 wherein after step (a) but before step (b) additional conductive metal is electroplated onto the conductive metal deposited onto said poly(arylene sulfide) substrate in step (a).

4. In a process for the production of a printed circuit board the improvement comprising including in said process the steps of:
   (i) depositing a conductive metal onto a poly(arylene sulfide) board by electroless plating;
   (ii) electroplating additional conductive metal onto the conductive metal deposited in accordance with step (i); and
   (iii) after completion of step (ii) allowing the plated board to age until the adhesion between said conductive metal and said poly(arylene sulfide) board is sufficiently strong such that the peel strength associated therewith is at least about 4 pounds per inch as measured in accordance with ASTM Test Method Part 9 B 533-79 Procedure A.

5. A process in accordance with claim 4 wherein said peel strength is at least about 5 pounds per inch.

6. A process in accordance with claim 4 wherein said poly(arylene sulfide) is poly(phenylene sulfide).

7. A process in accordance with claim 5 wherein said poly(arylene sulfide) is poly(phenylene sulfide).

8. A process in accordance with claim 7 wherein said conductive metal is copper.

9. A process in accordance with claim 7 wherein said conductive metal is nickel.

10. A process in accordance with claim 4 wherein after completion of step (ii) said poly(arylene sulfide) board is at least partially dried.

11. A process in accordance with claim 4 wherein after completion of step (ii) said poly(arylene sulfide) board is at least partially cured.

12. A process in accordance with claim 4 wherein after completion of step (ii) said poly(arylene sulfide) board is heated above ambient temperature.

13. A process in accordance with claim 10, 11 or 12 wherein said poly(arylene sulfide) is poly(phenylene sulfide).

14. A process in accordance with claim 4 wherein step (iii) comprises allowing the plated board to age for at least 5 days.

15. A process for the production of a printed circuit board comprising
   (a) etching a poly(arylene sulfide) board with a chemical etchant,
   (b) depositing a conductive metal onto preselected portions of said poly(arylene sulfide) board by electroless plating to form the circuitry of said printed circuit board, and
   (c) allowing the plated board to age until the adhesion between said conductive metal and said poly(arylene sulfide) board is at least about 4 pounds per inch as measured in accordance with ASTM Test Method Part 9 B 533-79 Procedure A.

16. A process for the production of a printed circuit board comprising
   (a) etching a poly(arylene sulfide) board with a chemical etchant,
   (b) depositing a conductive metal onto said poly(arylene sulfide) board by electroless plating; wherein at some time subsequent to said electroless plating a portion of said conductive metal is removed from said board leaving the remaining conductive metal in the form of the desired circuitry of said printed circuit board, and
   (c) allowing the plated board to age until the adhesion between said conductive metal and said poly(arylene sulfide) board is at least about 4 pounds per inch as measured in accordance with ASTM Test Method Part 9 B 533-79 Procedure A.

17. A process in accordance with claim 15 wherein additional conductive metal is electroplated onto the conductive metal deposited on said poly(arylene sulfide) board in (b).

18. A process in accordance with claim 15 wherein said chemical etchant is a strong oxidizing agent.

19. A process in accordance with claim 15 wherein said chemical etchant is nitric acid.

20. A process in accordance with claim 15 wherein said poly(arylene sulfide) board is grit blasted prior to step (a).

21. A process in accordance with claim 20 wherein ultrasonic cleaning is employed to remove loose material from the surface of said board after said board is grit blasted.

22. A process in accordance with claim 17 wherein said poly(arylene sulfide) is poly(phenylene sulfide).

23. A process in accordance with claim 22 wherein said conductive metal is copper.

24. A process in accordance with claim 19 wherein said poly(arylene sulfide) board is also etched with hydrofluoric acid.

25. A process in accordance with claim 15 or 16 further comprising (c) allowing the plated board to age for at least 5 days.

26. A method for obtaining improved adhesion between a conductive metal and a poly(arylene sulfide) substrate comprising (a) depositing said conductive metal onto said poly(arylene sulfide) substrate by electroless plating wherein the metal to substrate adhesion as measured immediately after the electroless plating is below about 4 pounds per inch, and (b) aging the plated substrate produced in (a) for a time sufficient for the adhesion between said conductive metal and said poly(arylene sulfide) substrate to increase to at least about 4 pounds per inch.

27. A process in accordance with claim 16 wherein additional conductive metal is electroplated onto the conductive metal deposited on said poly(arylene sulfide) board in (b).

28. A process in accordance with claim 16 wherein said chemical etchant is a strong oxidizing agent.

29. A process in accordance with claim 16 wherein said chemical etchant is nitric acid.

30. A process in accordance with claim 16 wherein said poly(arylene sulfide) board is grit blasted prior to step (a).

31. A process in accordance with claim 30 wherein ultrasomic cleaning is employed to remove loose material from the surface of said board after said board is grit blasted.

32. A process in accordance with claim 27 wherein said poly(arylene sulfide) is poly(phenylene sulfide).

33. A process in accordance with claim 32 wherein said conductive metal is copper.

34. A process in accordance with claim 29 wherein said polyarylene sulfide board is also etched with hydrofluoric acid.

* * * * *